United States Patent
Sudo

(10) Patent No.: US 7,960,769 B2
(45) Date of Patent: Jun. 14, 2011

(54) SOLID-STATE IMAGING DEVICE AND METHOD FOR MANUFACTURING SAME

(75) Inventor: Gaku Sudo, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 202 days.

(21) Appl. No.: 12/408,214

(22) Filed: Mar. 20, 2009

(65) Prior Publication Data

US 2010/0032736 A1 Feb. 11, 2010

(30) Foreign Application Priority Data

Aug. 6, 2008 (JP) .................................. 2008-203047

(51) Int. Cl.
*H01L 27/146* (2006.01)
*H01L 21/02* (2006.01)

(52) U.S. Cl. .................. 257/294; 257/350; 257/E27.13; 257/E21.002; 438/48; 438/70; 349/106

(58) Field of Classification Search .................. 257/294, 257/439, 350, E27.13, E21.002, E27.159, 257/E31.054; 438/48, 70; 349/106

See application file for complete search history.

(56) References Cited

U.S. PATENT DOCUMENTS

2008/0251822 A1  10/2008  Yamaguchi et al.

FOREIGN PATENT DOCUMENTS

JP  2008-091781  4/2008

*Primary Examiner* — Victor Mandala
*Assistant Examiner* — Whitney Moore
(74) *Attorney, Agent, or Firm* — Oblon, Spivak, McClelland, Maier & Neustadt, L.L.P.

(57) ABSTRACT

In a CMOS image sensor, an N-type semiconductor layer is formed on a P-type semiconductor substrate. P-type semiconductor regions are formed in one part of the semiconductor layer over the entire length of the thickness direction of the semiconductor layer in a lattice-like shape as viewed from above to compartment the semiconductor layer into a plurality of regions. Furthermore, a red filter, a green filter and a blue filter are provided in a red picture element, a green picture element and a blue picture element, respectively. Moreover, an N-type buried semiconductor layer being in contact with the semiconductor layer is formed in an immediately lower region of the red filter in an upper layer part of the semiconductor substrate.

20 Claims, 16 Drawing Sheets

SOLID-STATE IMAGING DEVICE AND METHOD FOR MANUFACTURING SAME

CROSS-REFERENCE TO RELATED APPLICATIONS

This application is based upon and claims the benefit of priority from the prior Japanese Patent Application No. 2008-203047, filed on Aug. 6, 2008; the entire contents of which are incorporated herein by reference.

BACKGROUND OF THE INVENTION

This invention relates to a solid-state imaging device and a method for manufacturing the same.

Background Art

Conventionally, in a solid-state imaging device such as CMOS (Complementary Metal Oxide Semiconductor) image sensor, an N-type semiconductor layer is formed on a P-type semiconductor substrate, and the N-type semiconductor layer is compartmented into a plurality of regions by a lattice-like P-type semiconductor region, and each of the regions composes an picture element. And, when light enters into each of the regions, charge is generated by photoelectric conversion, and by reading the charge as electric signal, the image data is obtained.

However, in such a solid-state imaging device, occasionally, the charge generated in a certain region leaks from this region and invades its adjacent region to generate color mixture. Moreover, when strong light is incident to a certain region to generate a large amount of charge, a phenomenon called as blooming in which the charge overflows to its adjacent region and the light seeps to the surrounding of the bright point in the obtained image is occasionally generated (for example, JP-A 2008-91781 (Kokai)).

SUMMARY OF THE INVENTION

According to an aspect of the invention, there is provided a solid-state imaging device including: a semiconductor substrate of a first conductivity type; a semiconductor layer of a second conductivity type formed on the semiconductor substrate; a semiconductor region of the first conductivity type formed over an entire length of a thickness direction of the semiconductor layer in a part of the semiconductor layer and compartmenting the semiconductor layer into a plurality of regions; a red filter disposed in an immediately upper region of one part of the regions; and a buried semiconductor layer of the second conductivity type formed in an immediately lower region of the red filter in an upper layer part of the semiconductor substrate and being in contact with the semiconductor layer.

According to another aspect of the invention, there is provided a solid-state imaging device including picture elements with a plurality of colors, including a semiconductor part in which a conductivity type of a base part thereof is a first conductivity type and a second conductivity type region compartmented by the picture elements is formed in an upper layer part thereof, and a depth of the second conductivity type region corresponding to the picture element having the color with the longest wavelength out of the plurality of colors being deeper than a depth of the second conductivity type region corresponding to the picture element having another color.

According to still another aspect of the invention, there is provided a method for producing a solid-state imaging device, including: forming a buried semiconductor layer of a second conductivity type in one part of an upper layer part of a semiconductor substrate of a first conductivity type; forming a semiconductor layer of the second conductivity type on the semiconductor substrate, the semiconductor layer being in contact with the buried semiconductor layer; forming a semiconductor region of the first conductivity type over an entire length of a thickness direction of the semiconductor layer in one part of the semiconductor layer to compartment the semiconductor layer into a plurality of regions; and forming a red filter on the semiconductor layer, the semiconductor region being formed so that one part of the regions are located in an immediately upper region of the buried semiconductor layer, and the red filter being disposed in an immediately upper region of the buried semiconductor layer.

DETAILED DESCRIPTION OF THE INVENTION

Hereinafter, embodiments of the invention will be described with reference to drawings.

First, a first embodiment of the invention will be described.

A solid-state imaging device according to the embodiment is a CMOS image sensor.

Figure 1:
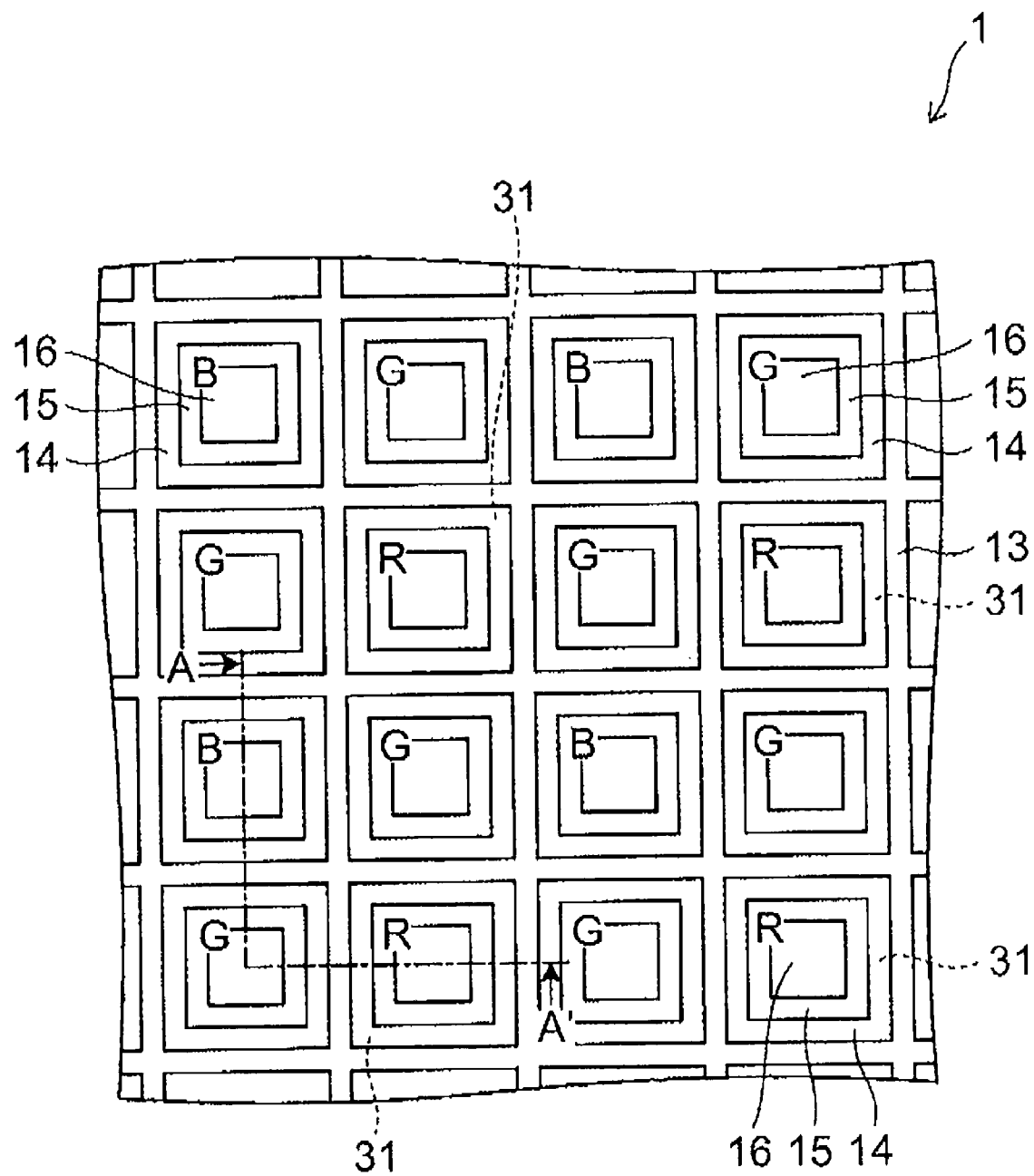
FIG. 1 is a plan view illustrating a CMOS image sensor according to a first embodiment of the invention.

FIG. 1 is a plan view illustrating the CMOS image sensor according to this embodiment.

Figure 2:
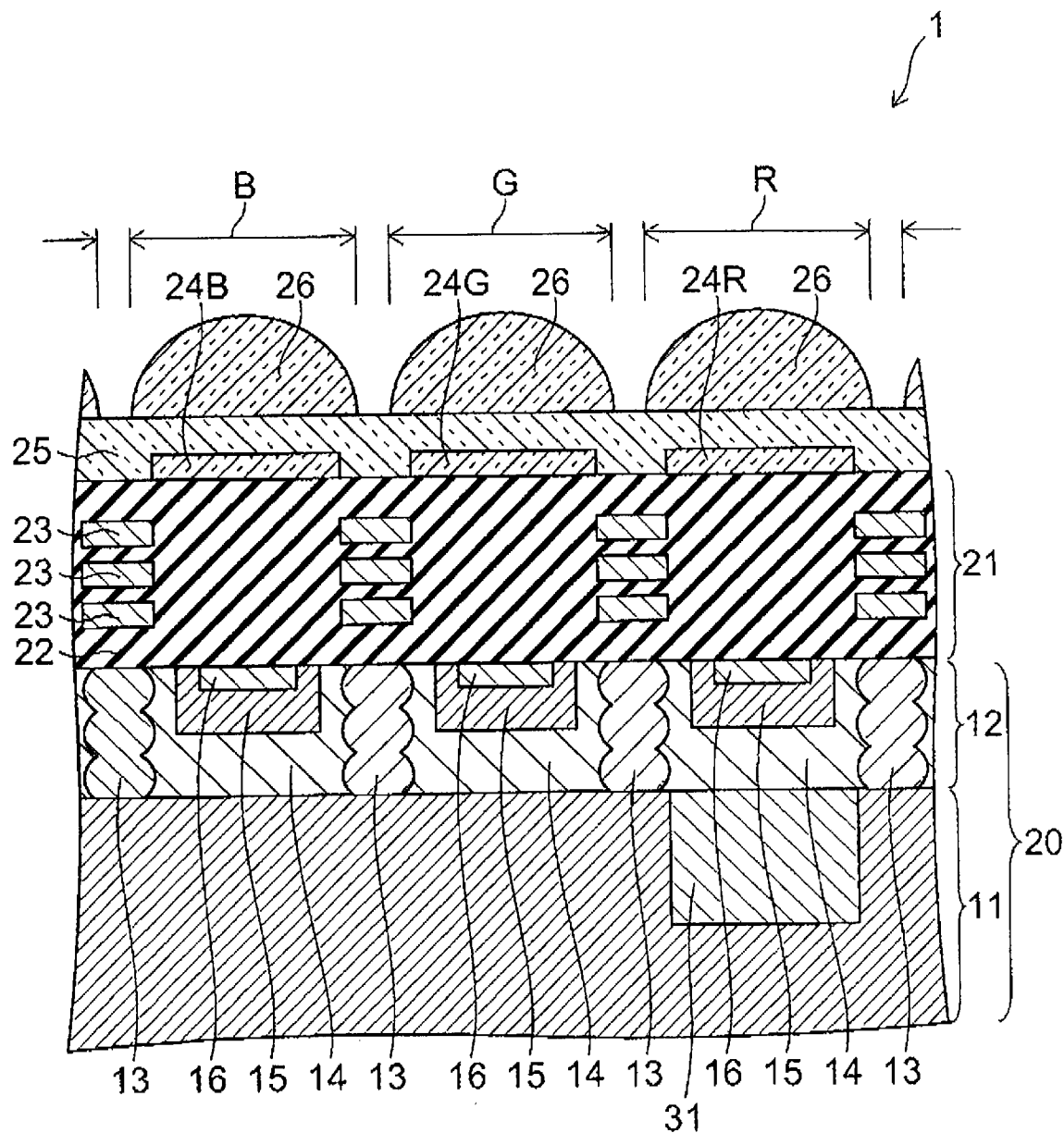
FIG. 2 is a cross-sectional view taken along line A-A' shown in FIG. 1.

FIG. 2 is a cross-sectional view taken along line A-A' shown in FIG. 1.

In addition, FIG. 1 shows an upper surface of a semiconductor part of the CMOS image sensor.

As shown in FIGS. 1 and 2, in a CMOS image sensor 1 according to this embodiment, a semiconductor substrate 11 made of silicon (Si) of, for example, single crystal is provided. The semiconductor substrate 11 contains an acceptor such as boron (B), and its conductive type is P-type. On the semiconductor substrate 11, a semiconductor layer 12 is formed. The semiconductor layer 12 is formed by, for example, epitaxial growth of silicon on the semiconductor substrate 11, and contains a donor such as phosphorous (P), and its conductive type is N-type. The thickness of the semiconductor layer 12 is, for example, 3 μm.

In one part of the semiconductor layer 12, a P-type semiconductor region 13 is formed. The semiconductor region 13 is formed over the entire length of the thickness direction of the semiconductor layer 12 from the upper plane of the semiconductor layer 12 to the interface between the semiconductor substrate 11 and the semiconductor layer 12 by a plurality of times of ion implantation. Moreover, as viewed from above, namely, from the perpendicular direction to the upper surface of the semiconductor substrate 11, the shape of the semiconductor region 13 is lattice-like. Thereby, by the lattice-like semiconductor region 13, the semiconductor layer 12 is compartmented into a plurality of regions 14 arranged in a matrix configuration. That is, side surfaces of the region 14 whose conductivity type is an N type are surrounded by the P-type semiconductor region 13, and the region 14 is electrically separated from the surrounding.

In the central portion of the upper layer part of each of the regions 14, a photo diode 15 is formed. The photo diode 15 is an N-type diffusion region into which a donor is implanted, and its donor concentration is higher than the donor concentration of the region 14. Moreover, in the central portion of the upper layer part of the photo diode 15, a shield layer 16 is formed. The shield layer 16 is a P-type diffusion region. A semiconductor part 20 of the CMOS image sensor 1 includes the semiconductor substrate 11, the semiconductor layer 12, the semiconductor region 13, the photo diode 15, and the shield layer 16. For example, entirety of the semiconductor part 20 is formed from single-crystal silicon.

On the semiconductor part 20, a multilevel wiring layer 21 is provided. In the multilevel wiring layer 21, an interlayer insulating film 22 is provided, and in a portion in the interlayer insulating film 22 except the immediately upper region of the photo diode 15, metal wires 23 are provided in a multilayer form. Moreover, in the immediately upper region of each of the regions 14 above the multilayer wiring layer 21, a red filter 24R, a green filter 24G, and a blue filter 24B (hereinafter, also generically referred to as "color filter") are provided. For example, the red filter 24R is a filter of mainly transmitting a red component out of the incident light and not substantially transmitting a green component and a blue component thereof. Furthermore, a planarization film 25 is formed so as to cover each of the color filters, and a microlens 26 is provided in a position corresponding to each of the color filters above the planarization film 25.

In the CMOS image sensor 1, a picture element is provided on each of the regions 14. That is, the picture elements are arranged in a matrix configuration along the longitudinal direction and the crosswise direction. There are three kinds of picture elements of red picture element R, green picture element G, and blue picture element B, and in the red picture element R, the red filter 24R is disposed, and in the green picture element G, the green filter 24G is disposed, and in the blue picture element B, the blue filter 24B is disposed. That is, in the immediately upper region of one part of the regions 14 out of the plurality of regions 14 compartmented by the semiconductor region 13, the red filter 24R is disposed, and in the immediately upper region of another part of the regions 14, the green filter 24R is disposed, and in the immediately upper region of the other part of the regions 14, the blue filter 24B is disposed. In the example shown in FIG. 1, the picture elements are arranged so as to have two rows and two columns, and one imaging unit is composed of four picture elements consisting of one red picture element R, two green picture elements G, and one blue picture element B.

And, in the CMOS image sensor 1 according to this embodiment, in the immediately lower region of the red filter 24R in the upper layer part of the semiconductor substrate 11, a burled semiconductor layer 31 having a conductivity type of N type is formed. The buried semiconductor layer 31 is formed by implanting a donor such as phosphorous into the semiconductor substrate 11, and its depth is for example 3 μm. Moreover, as viewed from above, namely, in FIG. 1, the periphery of the buried semiconductor layer 31 approximately coincides with the periphery of the region 14, namely, the interface between the semiconductor region 13 and the region 14. Moreover, the buried semiconductor layer 31 is in contact with the semiconductor layer 12, and constitutes an integrated N-type region extending in the vertical direction across the interface between the semiconductor substrate 11 and the semiconductor layer 12, with the region 14 located in the immediately lower region of the red filter 24R. In the immediately lower region of the green filter 24G and the immediately lower region of the blue filter 24B, the buried semiconductor layer 31 is not formed.

As described above, the CMOS image sensor 1 is a solid-state imaging device composed of a plurality of colors, namely, red, green, and blue picture elements. As for the semiconductor part 20 of the CMOS image sensor 1, the conductivity type of the base part (semiconductor substrate 11 and semiconductor region 13) is P type, and in the upper layer part, the N-type regions compartmented every picture element are formed. And, depth of an N-type region (the region 14 and the buried semiconductor layer 31) corresponding to the picture element having the color with the longest wavelength out of red and green and blue, namely, the red picture element is deeper than the depth of the N-type regions (regions 14) corresponding to the green picture element and the blue picture element.

Hereinafter, one example of the sizes of the respective parts of the CMOS image sensor 1 according to this embodiment will be presented.

Figure 3:
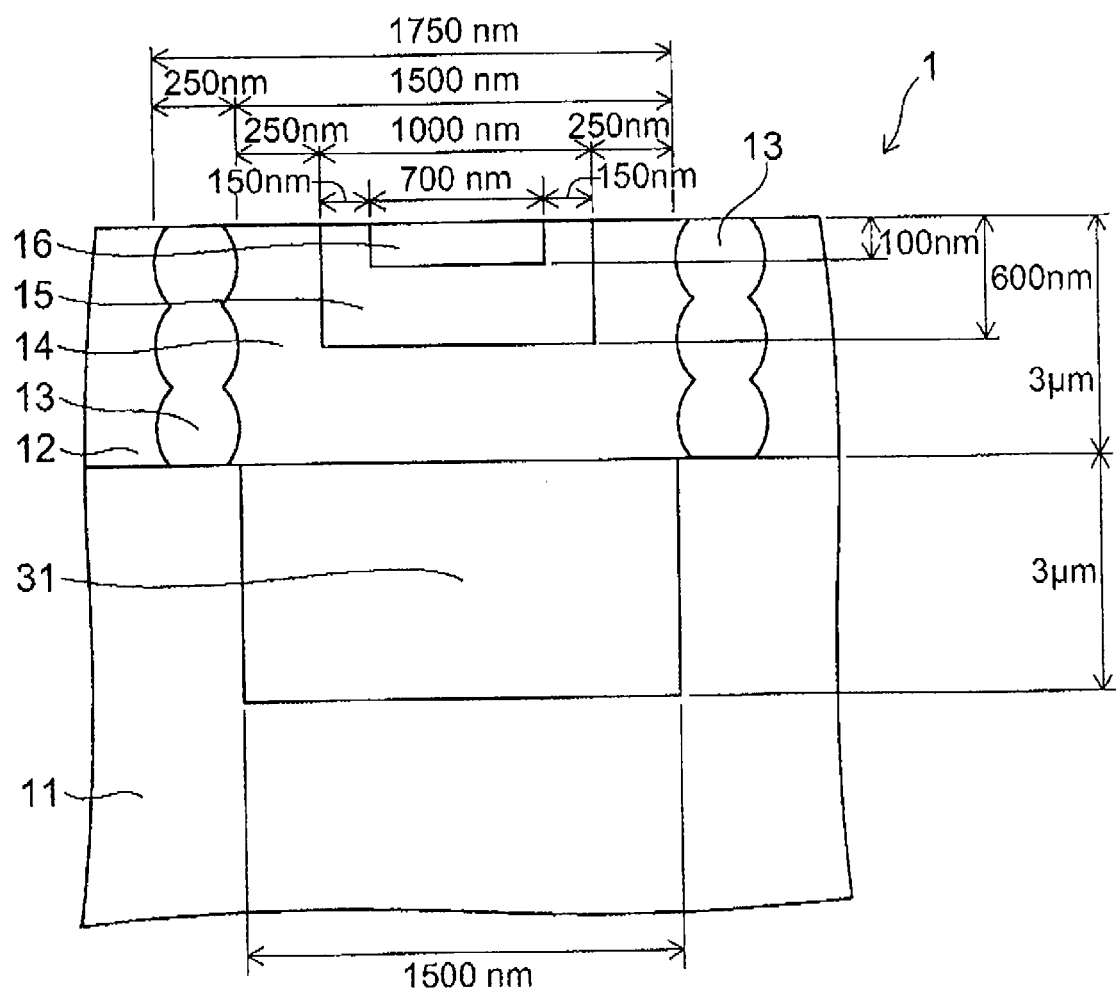
FIG. 3 is a cross-sectional view illustrating sizes of the respective parts in the CMOS image sensor according to the first embodiment and shows a semiconductor part of a red picture element.

FIG. 3 is a sectional view illustrating sizes of the respective parts in the CMOS image sensor according to this embodiment and shows the semiconductor part of the red picture element.

As shown in FIG. 3, in one example, the depth of the buried semiconductor layer 31 is 3 μm, and the thickness of the semiconductor layer 12 is also 3 μm. Therefore, the thickness of the semiconductor region 13 is also 3 μm. Moreover, the depth of the photo diode 15 is 600 nm, and the depth of the shield layer 16 is 100 nm. On the other hand, as viewed from above, the picture element pitch is 1750 nm, and out of the picture element pitch, the width of the semiconductor region 13 is 250 nm, and the width of the region 14 is 1500 nm. Also, the width of the buried semiconductor layer 31 is 1500 nm. Furthermore, the width of the photodiode 15 is 1000 nm, and therefore, the shortest distance between the photodiode 15 and the semiconductor region 13 is 250 nm. Furthermore, the width of the shield layer 16 is 700 nm, and therefore, the shortest distance between the periphery of the shield layer 16 and the periphery of the photodiode 15 is 150 nm.

Next, operation and effect of the CMOS image sensor 1 according to this embodiment composed as described above will be explained.

As shown in FIG. 2, in the CMOS image sensor 1, the light entering from the outside is converged by the microlens 26 and passes through the planarization film 25, and the wavelength is selected by the color filter, and the light passes thought the interlayer insulating film 22 of the multilevel wiring layer 21 and enters into the region 14. And, in the region 14, the incident light is photoelectrically converted to generate charge and the charge is collected to the photodiode 15. By reading the charge as the electric signal, the image data is obtained.

And, in this embodiment, in the immediately lower region of the red filter 24R, the buried semiconductor layer 31 is provided in the upper layer part of the semiconductor substrate 11, and therefore, in the red picture element R, the N-type region composed of the region 14 and the buried semiconductor layer 31 and extending in the vertical direction is formed. The N-type region functions as the photoelectric conversion section, and thereby, with certainly receiving the red component having the longest wavelength out of red, green, and blue light components, the thickness of the semiconductor layer 12 can be made to be thin. That is, the thickness of the semiconductor layer 12 can be made to be thin to the extent of being capable of certainly receiving the green light component. Thereby, the semiconductor region 13 can be made to certainly reach the semiconductor substrate 11, and each of the regions 14 can be certainly surrounded by the semiconductor substrate 11 and the semiconductor region 13. As a result, the regions 14 can be certainly electrically separated from one another, the charge generated in the bottom of the N-type region can be prevented from leaking to another region 14. Thereby, color mixture and blooming can be suppressed.

Next, a comparative example of this embodiment will be described.

Figure 4:
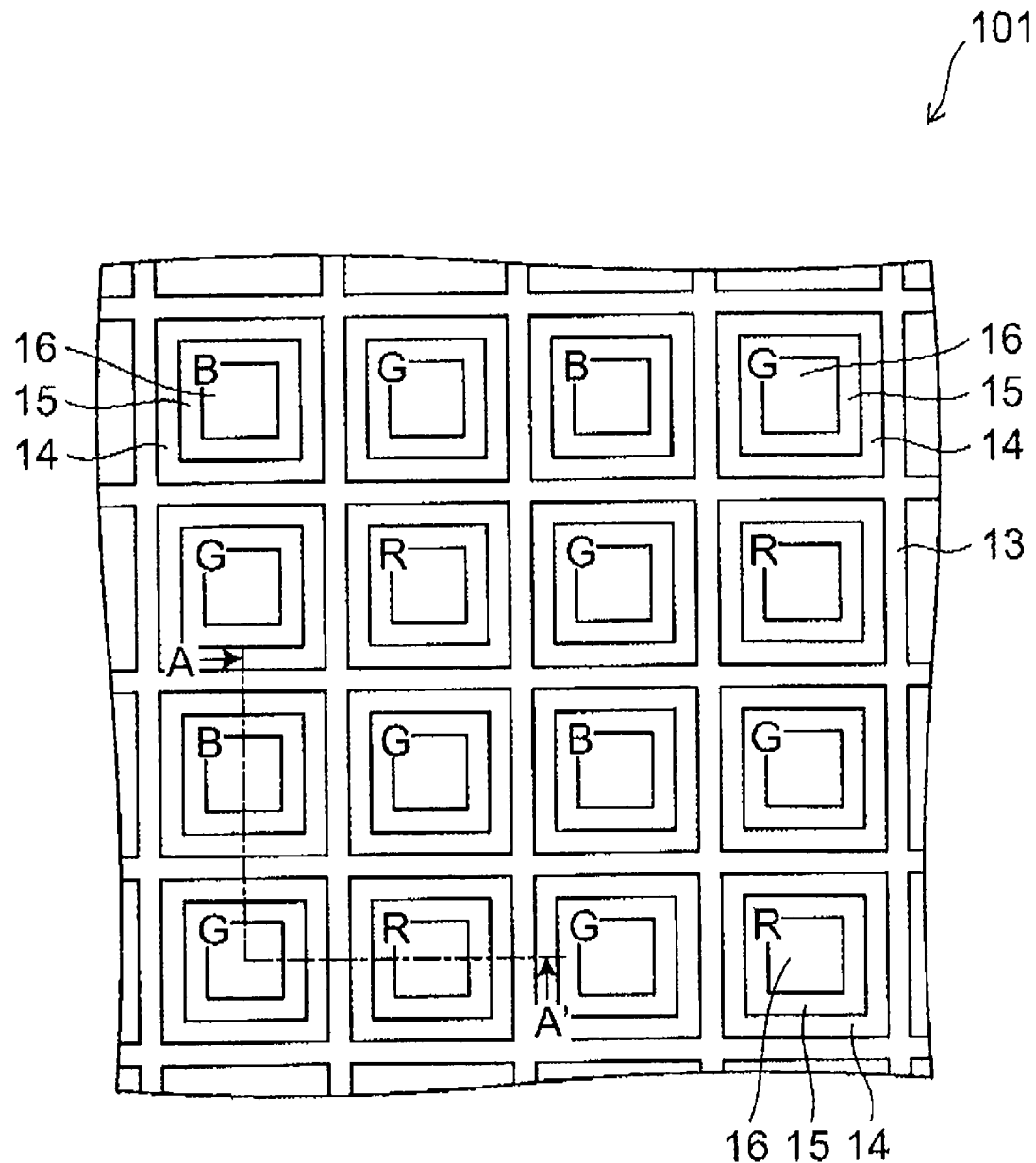
FIG. 4 is a plan view illustrating a CMOS image sensor according to a comparative example.

FIG. 4 is a plan view illustrating the CMOS image sensor according to this comparative example.

Figure 5:
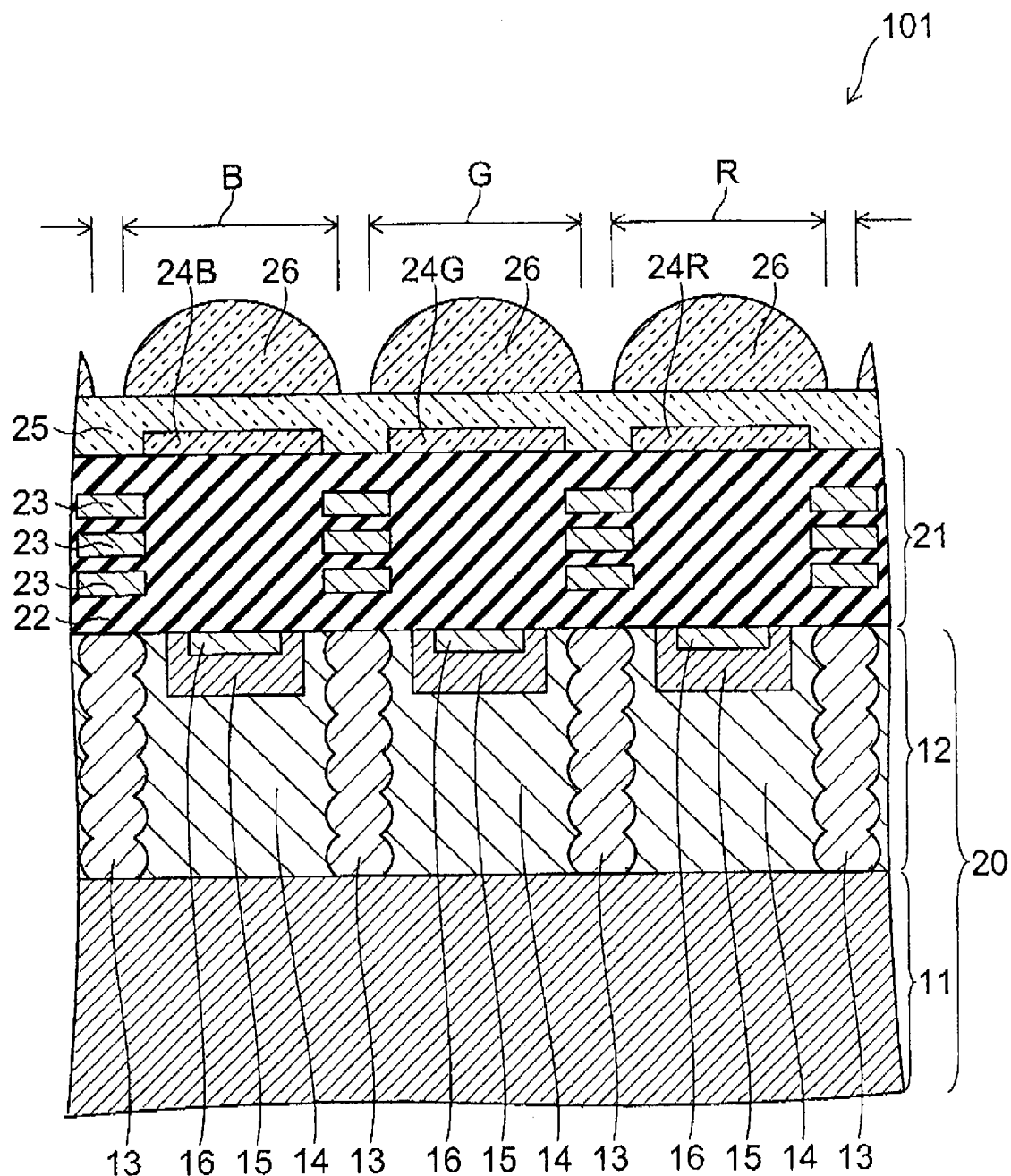
FIG. 5 is a cross-sectional view taken along line A-A' shown in FIG. 4.

FIG. 5 is a cross-sectional view taken along line A-A' shown in FIG. 4.

Figure 6:
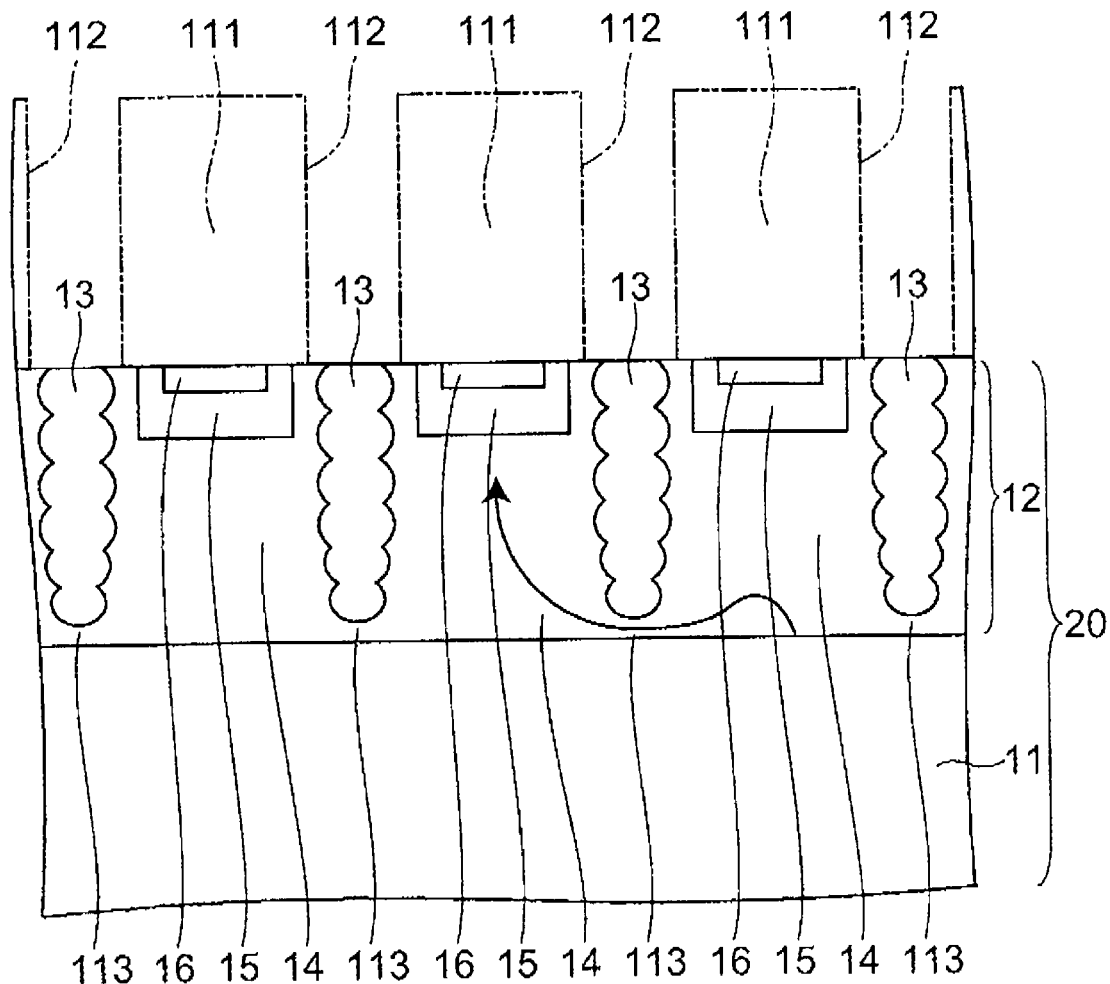
FIG. 6 is a sectional view illustrating the case of miniaturizing the CMOS image sensor shown in FIG. 5.

FIG. 6 is a cross-sectional view illustrating the case of miniaturizing the CMOS image sensor shown in FIG. 5.

As shown in FIGS. 4 and 5, in the CMOS image sensor 101 according to this comparative example, the buried semiconductor layer 31 (see FIG. 2) is not provided, compared to the above CMOS image sensor 1 according to the first embodiment. Therefore, the semiconductor layer 12 is required to have the thickness of being capable of certainly receiving the red light component, for example, 6 µm. Also, in the CMOS image sensor 101, if the semiconductor region 13 reaches the semiconductor substrate 11 and the regions 14 can be certainly compartmented, leakage of the charge is small, and color mixture and blooming is difficult to be caused.

However, as shown in FIG. 6, if the CMOS image sensor 101 is miniaturized and the picture element pitch becomes small, the following problems are caused. That is, in forming the semiconductor region 13, a photoresist film 111 is formed on the semiconductor layer 12, and the photoresist film 111 is patterned to form the openings 112, and an acceptor is implanted so that the photoresist film 111 serves as a mask. However, if the picture element pitch becomes small, the aspect ratio of the openings 112 becomes large when the film thickness of the photoresist film 111 is constant, and the patterning is difficult to be performed, and therefore, the film thickness of the photoresist film 111 has no other choice than to be made to be thin. Therefore, it becomes necessary that the acceleration voltage in implanting the acceptor is made to be lower to the extent that the acceptor does not pass through the photoresist film 111. Therefore, the acceptor becomes difficult to reach the lower layer part of the semiconductor layer 12. As a result, a void 113 becomes to be formed between the P-type semiconductor substrate 11 and the P-type semiconductor region 13, and separation between the regions 14 becomes insufficient. Thereby, after the CMOS image sensor 101 is achieved, when the light is received, the charge comes to leak through the void 113 as shown by the arrow in FIG. 6, and color mixture and blooming are caused.

If the acceleration voltage of the ion implantation is enhanced in forming the semiconductor region 13 for avoiding this problem, the acceptor comes to pass through the photoresist film 111. Moreover, if the photoresist film 111 is made to be thicker, the miniaturization becomes difficult. Furthermore, if a hard mask or the like is used instead of the photoresist film 111, difficulty of the process rises and the manufacturing cost increases. On the other hand, if the semiconductor layer 12 is made to be thinner, the red light component having a long wavelength cannot be efficiently received.

By contrast, as described above, according to the first embodiment, in the red picture element R, the buried semiconductor layer 31 is formed in the upper layer part of the semiconductor substrate 11 and forms a deep N-type light-receiving region with the region 14, and therefore, with certainly receiving the red light component, the thickness of the semiconductor layer 12 can be thinner than the thickness required for receiving the red light component. As a result, because the semiconductor layer 12 can be thinner, if the CMOS image sensor 1 is miniaturized, the problem that the above void 113 is formed between the semiconductor substrate 11 and the semiconductor region 13 is not caused, and the color mixture and blooming can be suppressed.

Next, the second embodiment of the invention will be described.

Figure 7:
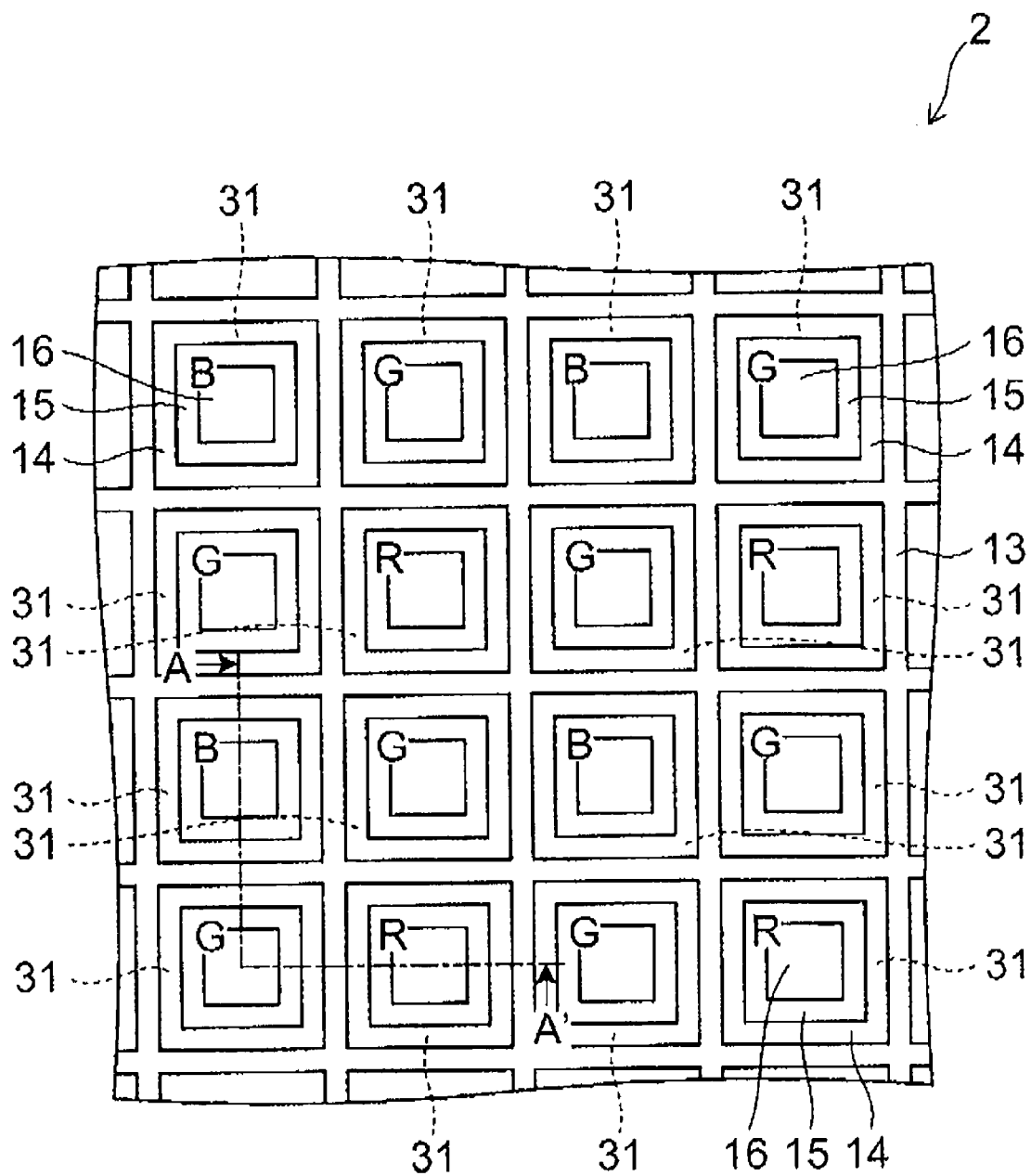
FIG. 7 is a plan view illustrating a CMOS image sensor according to a second embodiment of the invention.

FIG. 7 is a plan view illustrating the CMOS image sensor according to this embodiment.

Figure 8:
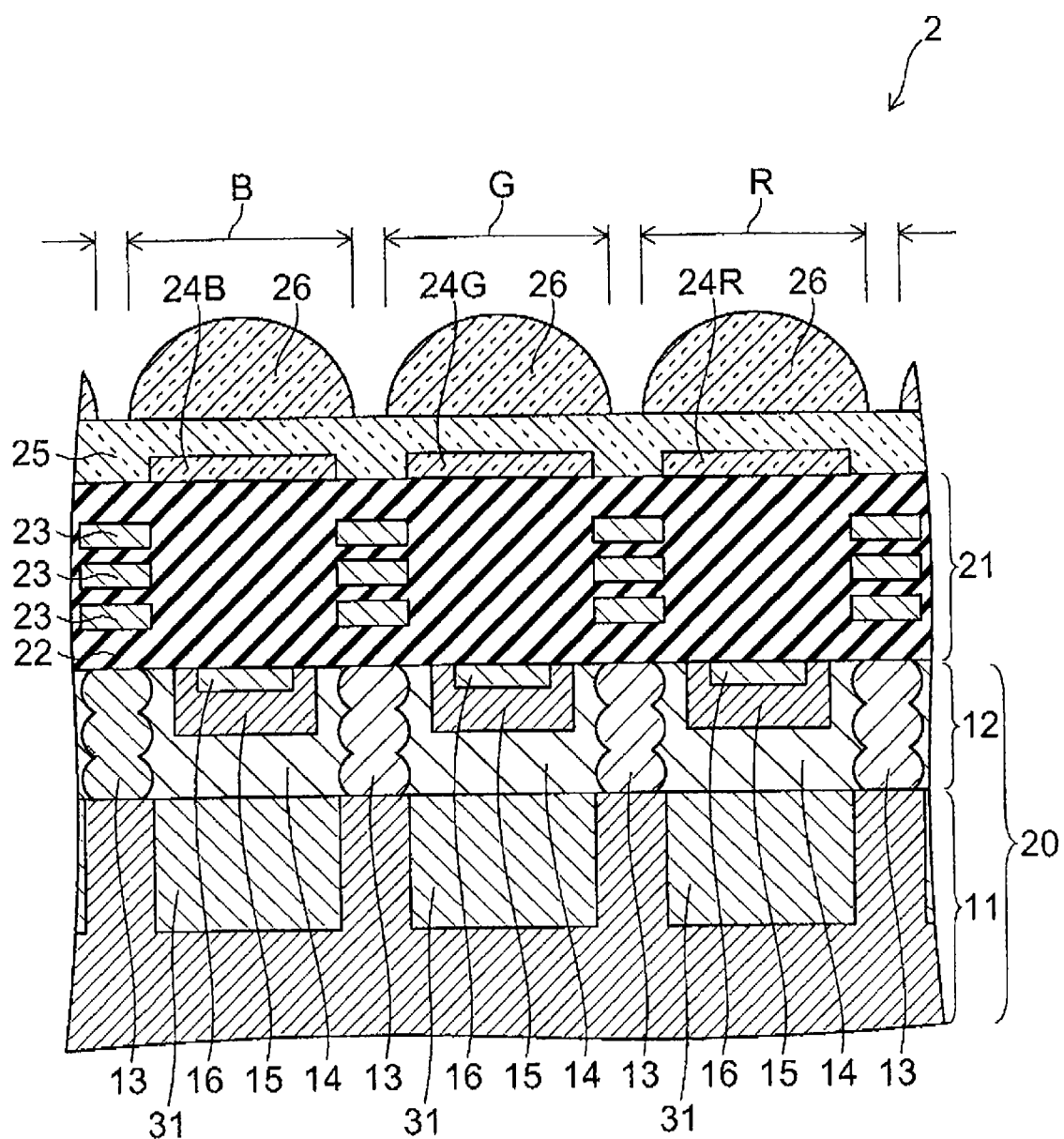
FIG. 8 is a cross-sectional view taken along line A-A' shown in FIG. 7.

FIG. 8 is a cross-sectional view taken along line A-A' shown in FIG. 7.

FIG. 7 shows the upper surface of the semiconductor part of the CMOS image sensor.

As shown in FIGS. 7 and 8, in the CMOS image sensor 2 according to this embodiment, the buried semiconductor layer 31 is provided in the green picture element G and the blue picture element B as well as the red picture element R. That is, the donor is also implanted into the immediately lower regions of the green filter 24G and the blue filter 24B in the upper layer parts of the semiconductor substrate 11, and thereby the N-type buried semiconductor layers 31 are formed. The depths of the buried semiconductor layers 31 are approximately equal to one another. The configurations in this embodiment other than the foregoing are the same as those in the first embodiment described above.

According to this embodiment, compared to the first embodiment described above, the green and blue light components can also be received by N-type regions composed of the region 14 and the buried semiconductor layer 31, and therefore, the semiconductor layer 12 can be made to be thinner. On the other hand, according to the first embodiment described above, in the photoresist film (not shown) in forming the buried semiconductor layers 31, the interspaces between the openings can be large, and therefore, the difficulty of the process can be lower than that of this embodiment. The operations and the effects in this embodiment other than the foregoing are the same as those in the first embodiment described above.

Next, a third embodiment of the invention will be described.

Figure 9:
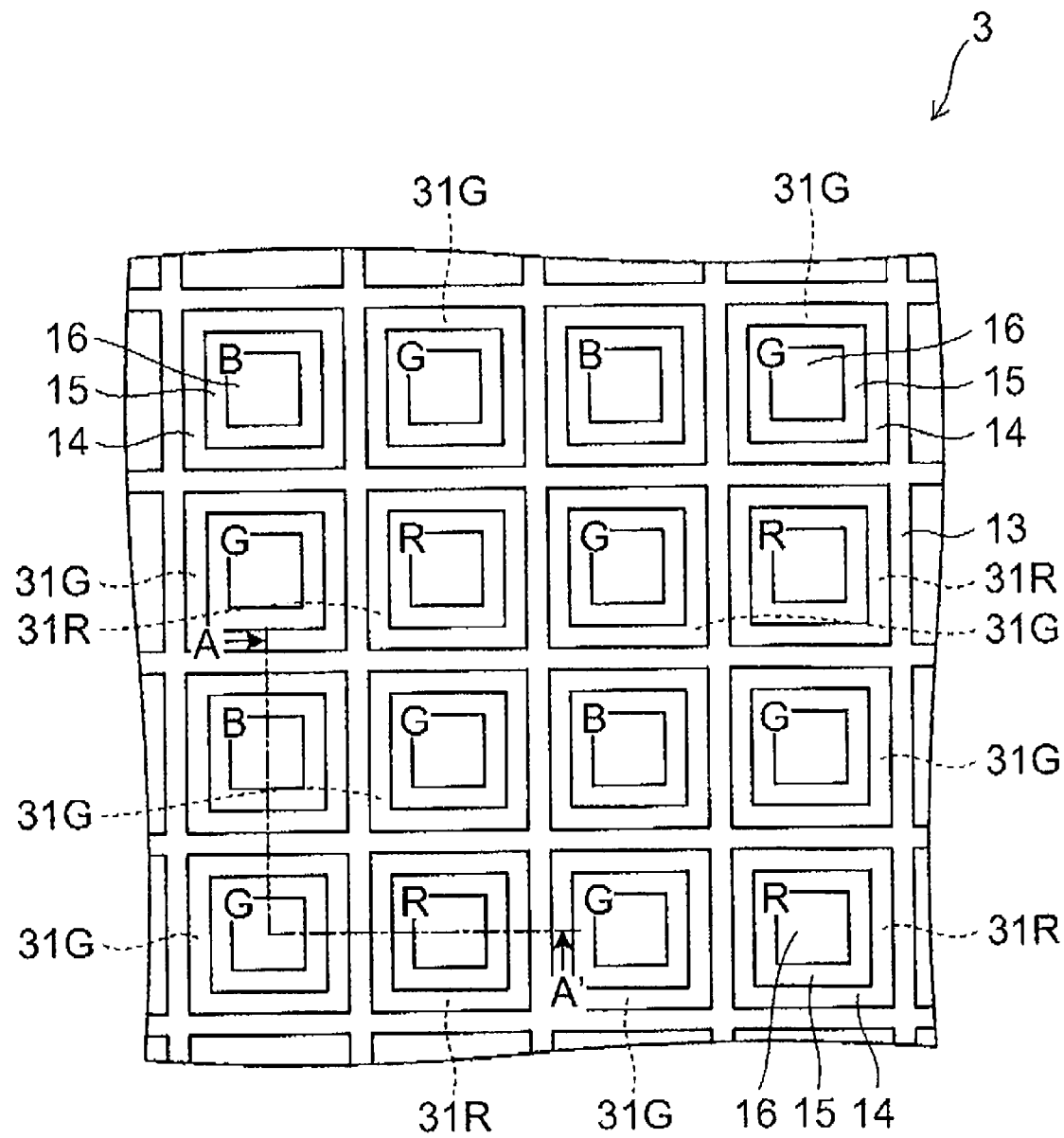
FIG. 9 is a plan view illustrating a CMOS image sensor according to a third embodiment of the invention.

FIG. 9 is a plan view illustrating a CMOS image sensor according to this embodiment.

Figure 10:
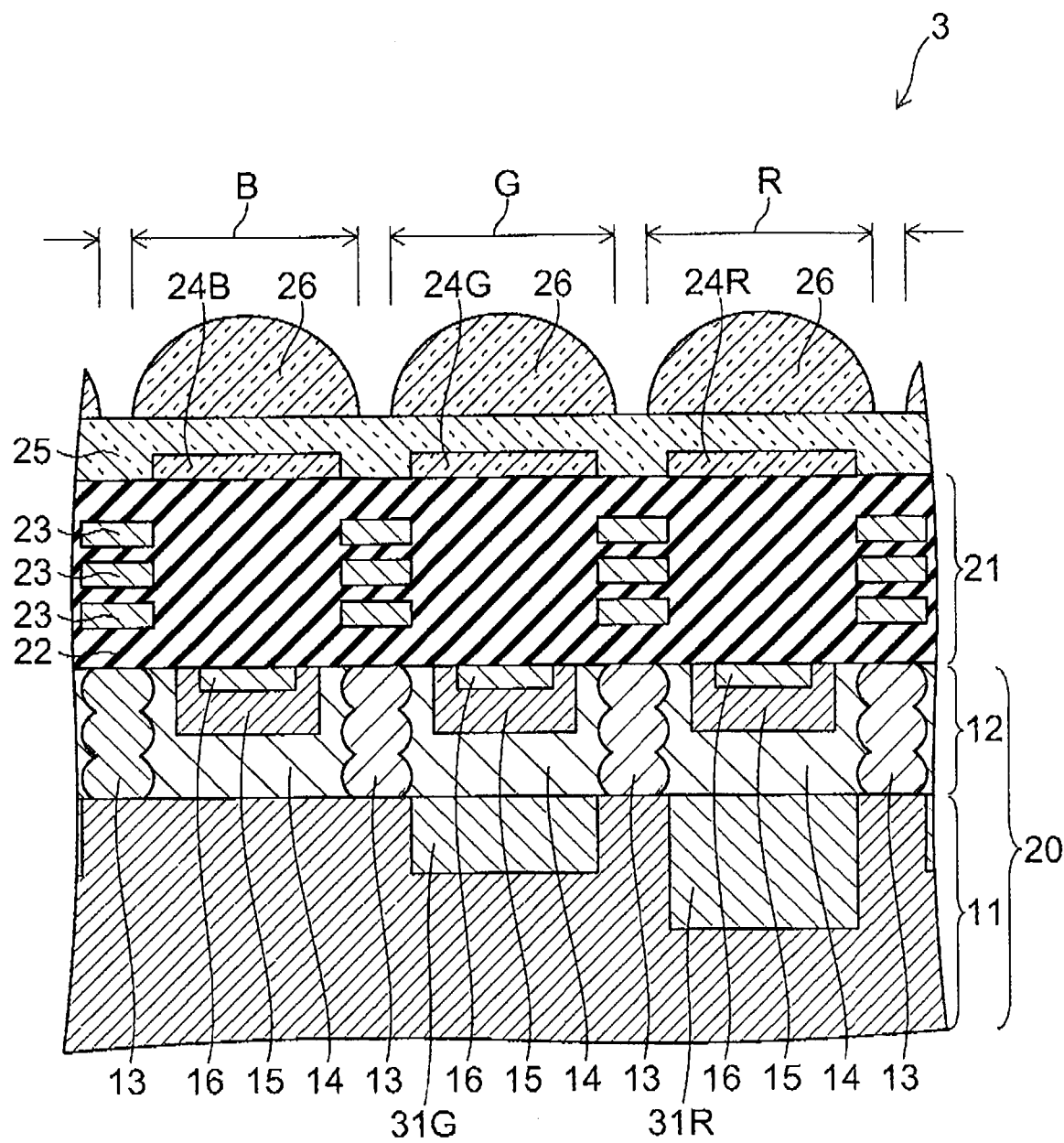
FIG. 10 is a cross-sectional view taken along line A-A' shown in FIG. 9.

FIG. 10 is a cross-sectional view taken along line A-A' shown in FIG. 9.

FIG. 9 shows the upper surface of the semiconductor part of the CMOS image sensor.

As shown in FIGS. 9 and 10, in the CMOS image sensor 3 according to this embodiment, compared to the above CMOS image sensor 1 according to the first embodiment (see FIGS. 1 and 2), the buried semiconductor layer is provided in the green picture element G as well as the red picture element R, and the depth of the buried semiconductor layer 31G provided in the green picture element G is shallower than the depth of the buried semiconductor layer 31R provided in the red picture element R. For example, the depth of the buried semiconductor layer 31R is 3 μm and the depth of the buried semiconductor layer 31G is 1 μm. In the blue picture element B, the buried semiconductor layer is not provided. The configurations in this embodiment other than the foregoing are the same as those in the first embodiment described above.

According to this embodiment, the light-receiving region of the red picture element R can be formed to be the deepest, and the light-receiving region of the green picture element G can be formed to be the second deepest. Thereby, the light-receiving regions each having the depth corresponding to the wavelength of the light component received in each of the picture elements can be formed. For example, in the above example, when the thickness of the semiconductor layer 12 is 3 μm, the depth of the light-receiving region of the red picture element R is 6 μm, which is the total thickness of the region 14 and the burled semiconductor layer 31R, and the depth of the light-receiving region of the green picture element G is 4 μm, which is the total thickness of the region 14 and the buried semiconductor layer 31G, and the depth of the light-receiving region of the blue picture element B is 3 μm, which is the thickness of the region 14.

As a result, the light-receiving efficiency of each of the picture elements becomes uniform, and the thickness of the semiconductor layer 12 can be thin to the extent required for receiving the blue light component. However, because the acceleration voltages of the ion implantation in forming the burled semiconductor layers 31R and 31G are different, the buried semiconductor layers are required to be formed in the different processes. Therefore, according to the first embodiment described above, compared to this embodiment, the number of the processes can be reduced. The operations and effects in this embodiment other than the foregoing are the same as those in the first embodiment described above.

Next, a fourth embodiment of the invention will be described.

Figure 11:
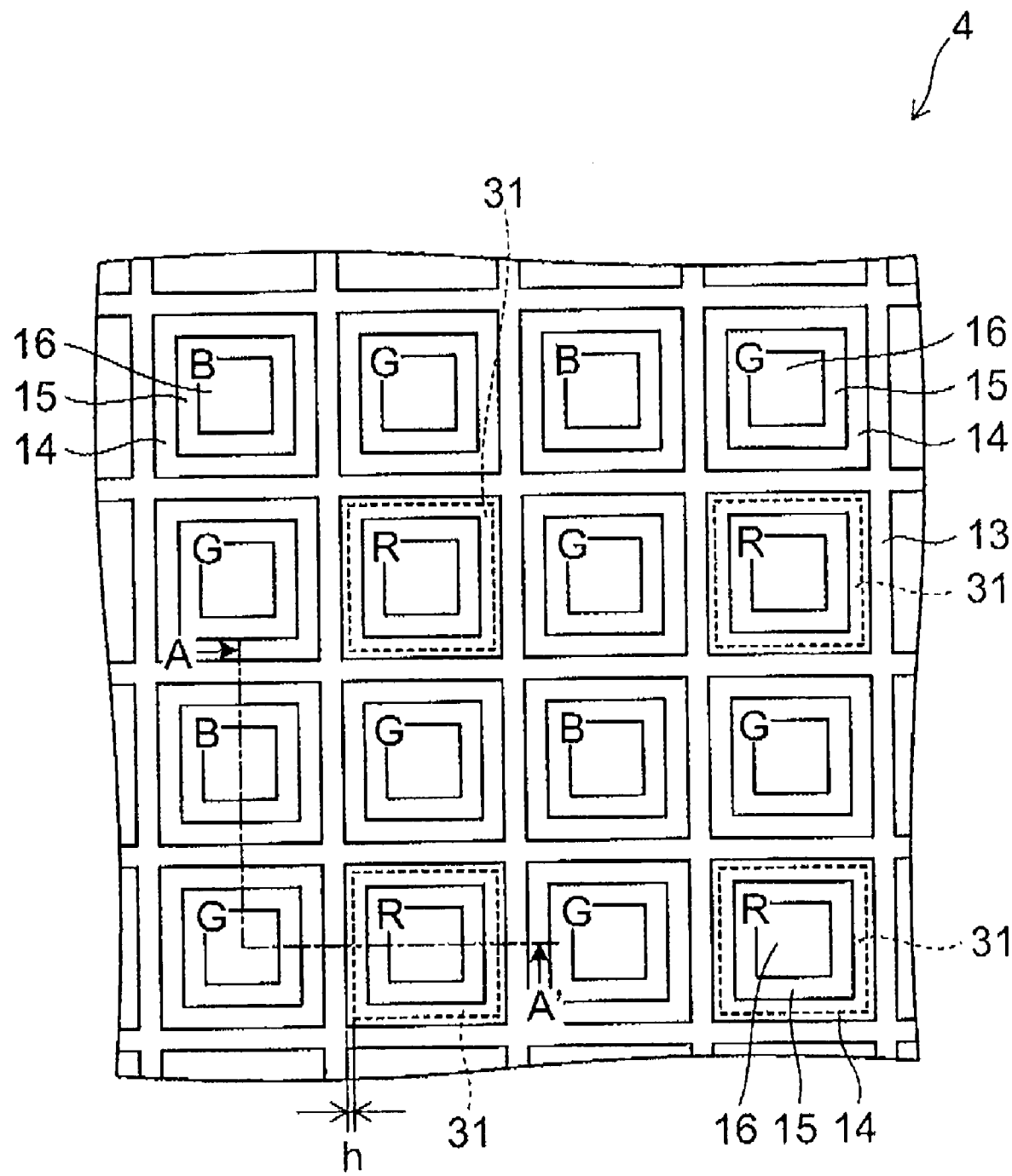
FIG. 11 is a plan view Illustrating a CMOS image sensor according to a fourth embodiment of the invention.

FIG. 11 is a plan view illustrating the CMOS image sensor according to this embodiment.

Figure 12:
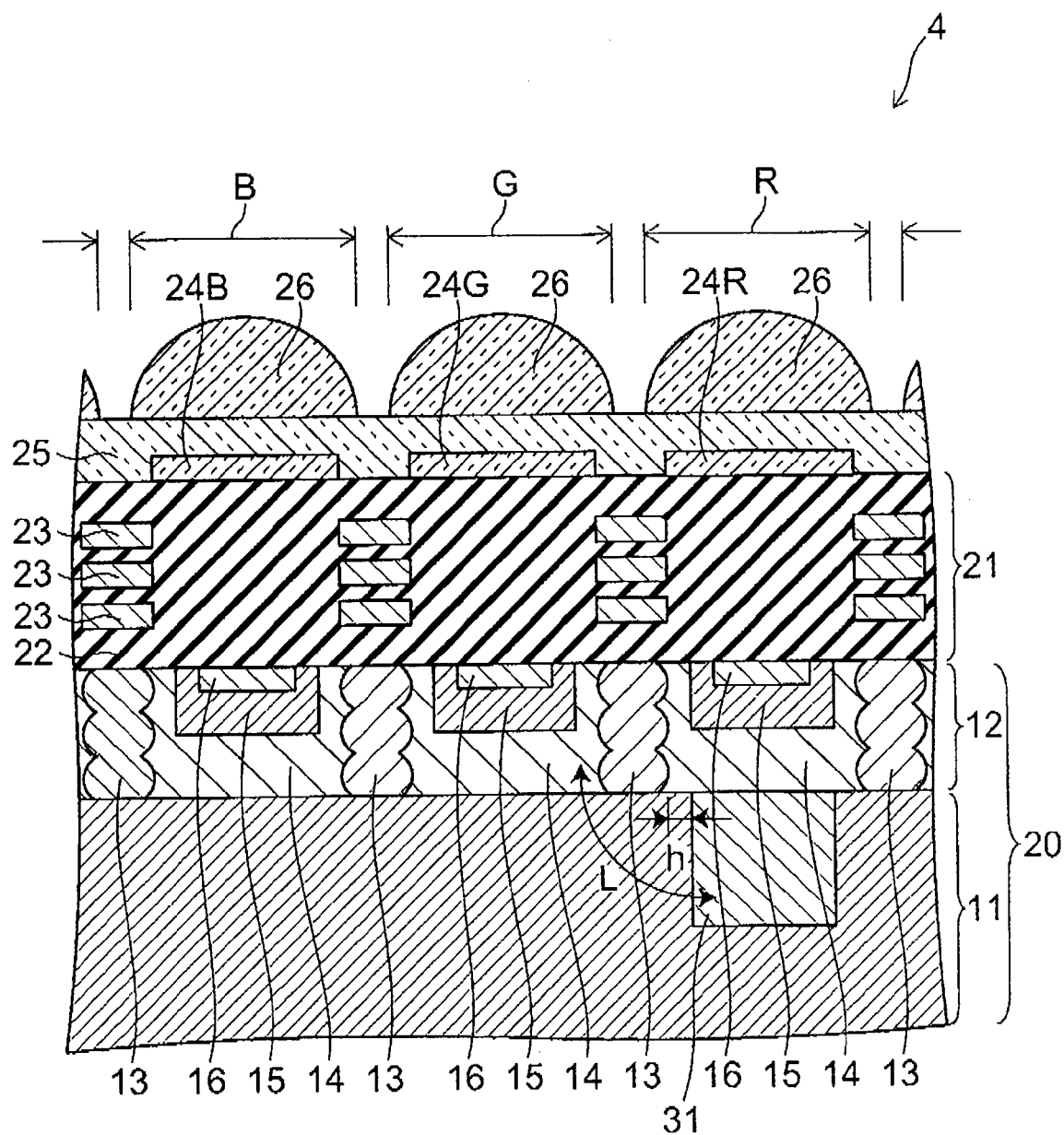
FIG. 12 is a cross-sectional view taken along line A-A' shown in FIG. 11.

FIG. 12 is a cross-sectional view taken along line A-A' shown in FIG. 11.

FIG. 11 shows the upper surface of the semiconductor part of the CMOS image sensor.

As shown in FIGS. 11 and 12, the CMOS image sensor 4 according to this embodiment is different from the CMOS image sensor 1 according to the above first embodiment (see FIGS. 1 and 2) in the point that the buried semiconductor layer 31 is disposed inside the region 14 as viewed from above. That is, as viewed from above, the periphery of the buried semiconductor layer 31 is located from the interface between the region 14 and the semiconductor region 13 internally in the region 14. The distance h shown in FIGS. 11 and 12, namely, the distance between the periphery of the buried semiconductor layer 31 as viewed from above and the interface between the region 14 and the semiconductor region 13 is, for example, approximately a twentieth part of the picture element pitch. The configurations in this embodiment other than the foregoing are the same as those in the first embodiment.

According to this embodiment, as viewed from above, the buried semiconductor layer 31 is disposed inside the region 14, and thereby, as shown in FIG. 12, the distance L between the buried semiconductor layer 31 of the red picture element R and the region 14 of the green picture element G contiguous thereto can be set to be large. Thereby, the picture elements can be certainly separated from one another.

Moreover, as the distance h is larger, even if displacement is caused between forming the semiconductor substrate 11 and forming the semiconductor region 13, the buried semiconductor layer 31 of the red picture element R can be more certainly prevented from being in contact with the region 14 of the green picture element G, and color mixture and blooming can be more effectively suppressed. On the other hand, if the distance is set to be too large, the area of the light-receiving region decreases, and therefore, the generation amount of the charge deceases. Accordingly, in this embodiment, by setting the distance h to be approximately a twentieth part of the picture element pitch, sufficient margin is ensured with respect to displacement between the processes with holding the light-receiving efficiency, and the color mixture and the blooming can be certainly suppressed. The operations and the effects in this embodiment other than the foregoing are the same as those in the first embodiment described above.

This embodiment may be carried out in combination with the second and third embodiments described above and the fifth embodiment to be described later.

Next, a fifth embodiment of the invention will be described.

Figure 13:
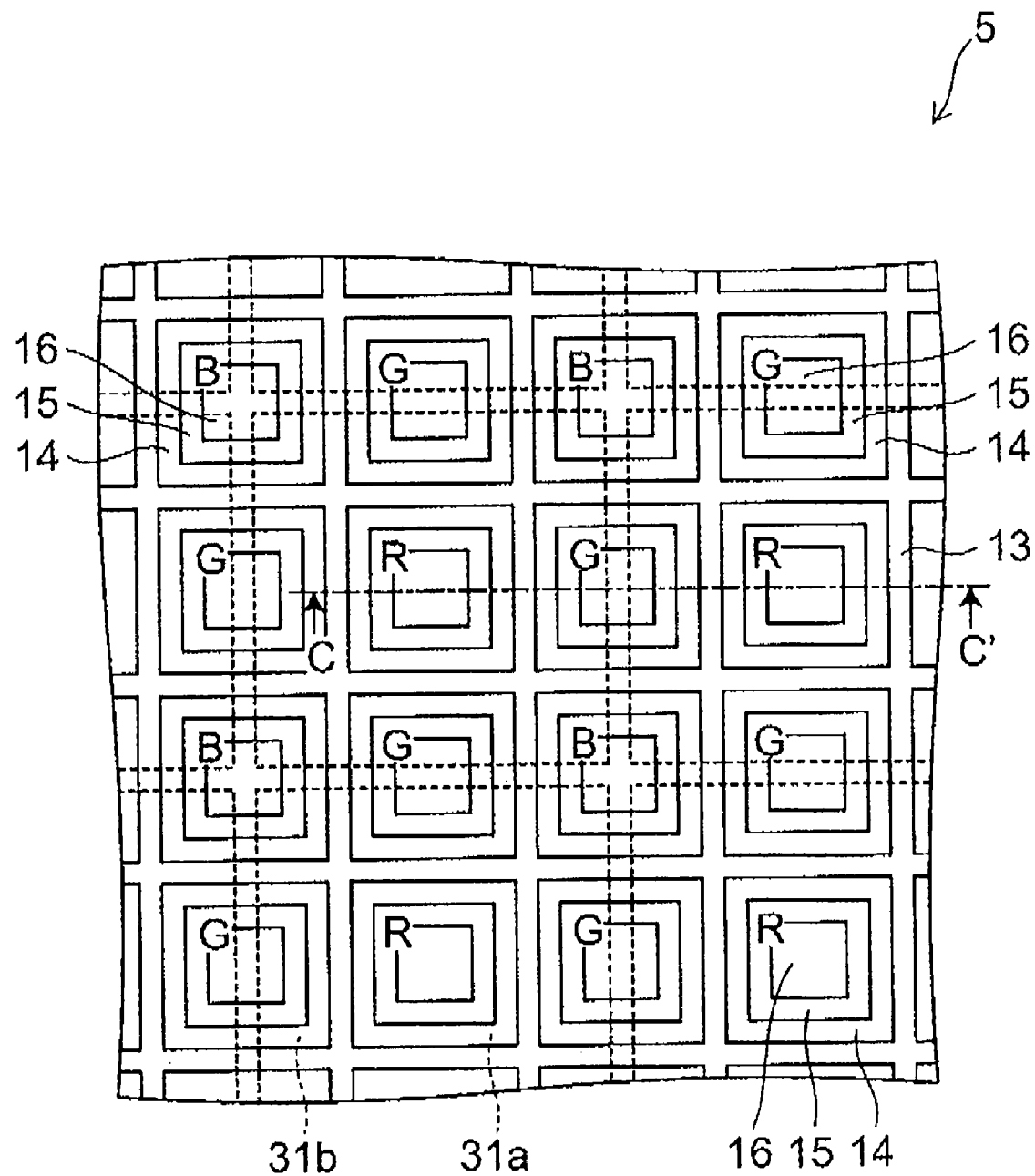
FIG. 13 is a plan view illustrating a CMOS image sensor according to a fifth embodiment of the invention.

FIG. 13 is a plan view illustrating the CMOS image sensor according to this embodiment.

Figure 14:
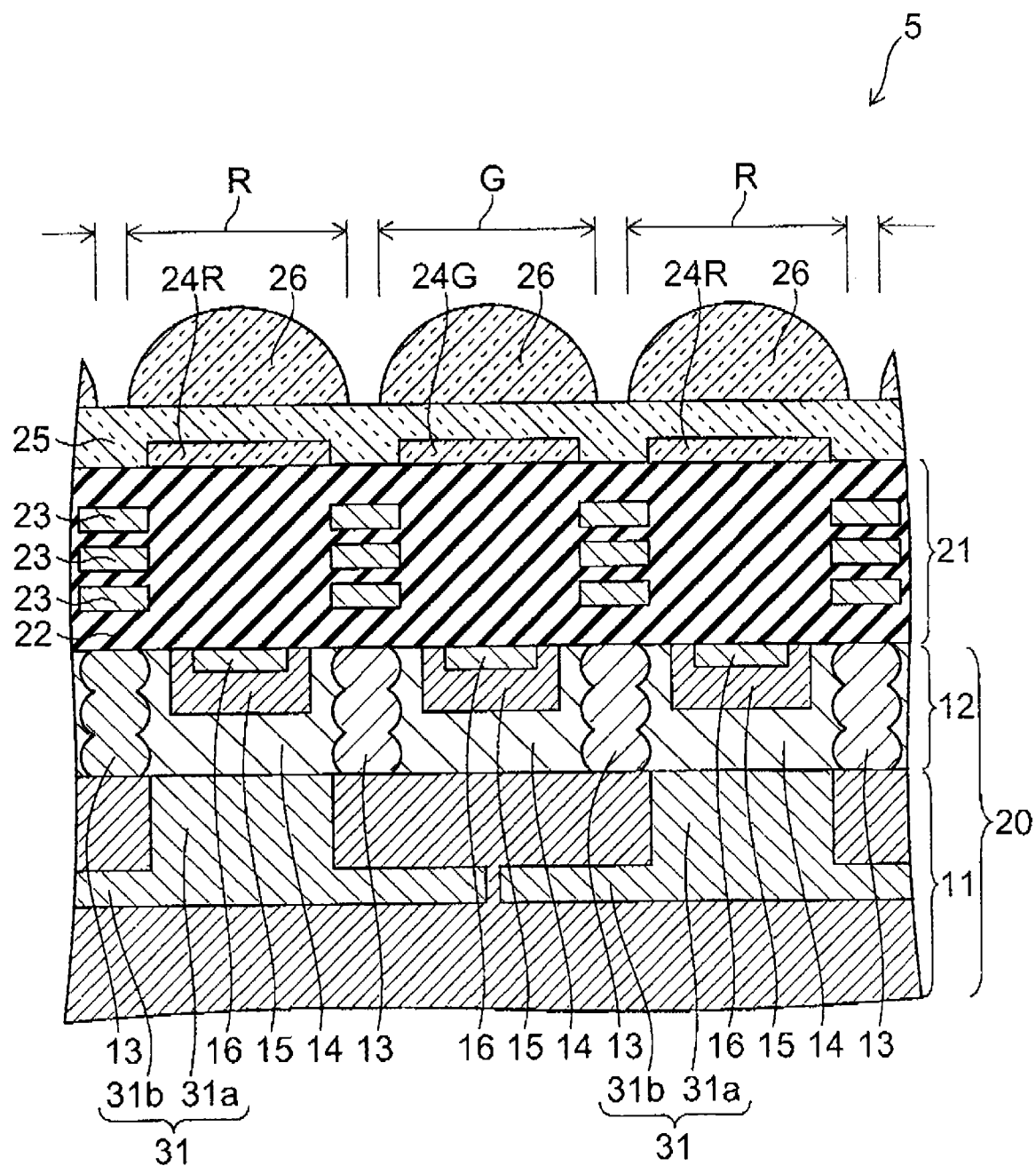
FIG. 14 is a cross-sectional view taken along line C-C' shown in FIG. 13.

FIG. 14 is a cross-sectional view taken along line C-C' shown in FIG. 13.

FIG. 13 shows the upper surface of the semiconductor part of the CMOS image sensor.

As shown in FIGS. 13 and 14, in the CMOS image sensor according to this embodiment, the buried semiconductor layer 31 is composed of an upper part 31a and a lower part 31b, and as viewed from above, the lower part 31b is formed to be in a wider range than that of the upper part 31a. That is, the lower part 31b of the buried semiconductor layer 31 belonging to each of the red picture elements R jetties out to four directions, and extends across the periphery of the region 14 corresponding to this red picture element R, and reaches the immediately lower regions of four green picture elements G contiguous to this red picture element R and four blue picture elements B located in the diagonal positions from this red picture element R. Thereby, the shape of the lower part 31b is approximately rectangular as viewed from above. However, the lower parts 31b of the buried semiconductor layers 31 belonging to the different red picture elements R are not in contact with one another, and electrically separated from one another. The buried semiconductor layer 31 is not provided in the green picture elements G and the blue picture elements B.

In one example, the thickness of the entirety of the buried semiconductor layer 31 is 3 μm, and the thickness of the upper part 31a out of the thickness of the entirety is 2 μm, and the thickness of the lower part 31b is 1 μm. The upper part 31a and the lower part 31b are formed by discrete ion implantation processes, and the ion implantation for forming the lower part 31b is performed for the wider range and by higher acceleration voltage than those of the ion implantation for forming the upper part 31a. The configurations in this embodiment other than the foregoing are the same as those in the first embodiment described above.

In this embodiment, by expanding the lower part 31b of the buried semiconductor layer 31, the volume can be increased without deepening the depth of the buried semiconductor layer 31, and the capability for accumulating the charge can be enhanced. Thereby, even if strong light enters into the red picture element R to excessively generate the charge, the charge is held so that the lower part 31b of the buried semiconductor layer 31 serves as a buffer, and the charge can be prevented from flowing out to another picture element. Thereby, blooming can be more certainly suppressed. The operations and effects in this embodiment other than the foregoing are the same as those in the first embodiment described above.

Next, a sixth embodiment of the invention will be explained.

This embodiment is an embodiment of a method for manufacturing the CMOS image sensor 3 according to the third embodiment described above (see FIGS. 9 and 10).

FIGS. 15 to 18 are process cross-sectional views illustrating the method for manufacturing the CMOS image sensor according to this embodiment.

FIGS. 15 to 18 correspond to the cross-section taken along line A-A' shown in FIG. 9.

Figure 15:
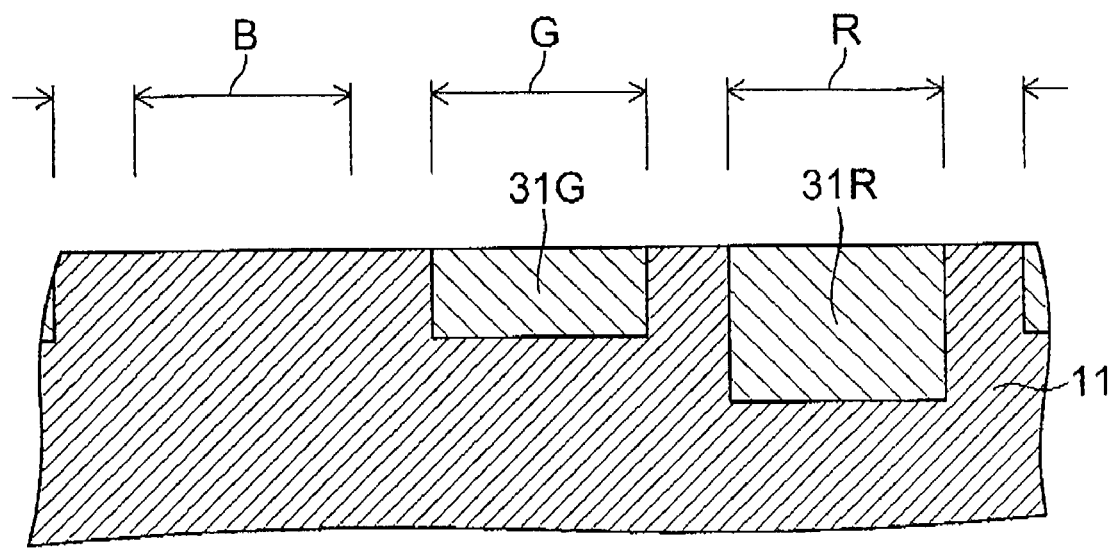
FIG. 15 is a process cross-sectional view illustrating a method for manufacturing a CMOS image sensor according to a sixth embodiment of the invention.

First, as shown in FIG. 15, the semiconductor substrate 11 made of, for example, single-crystal silicon and whose conductivity type is P-type is prepared. Next, a photoresist film (not shown) is formed on the semiconductor substrate 11, and the regions in which the red picture elements R will be formed are opened. And, the donor is implanted using the photoresist film as the mask, and thereby, the buried semiconductor layer 31R whose conductivity type is N-type and whose depth is, for example, 3 μm is formed in one part of the upper layer part of the semiconductor substrate 11. Then, the photoresist film is removed.

Next, a new photoresist film is formed, and the regions in which the green picture elements G will be formed are opened. And, the donor is implanted using the new photoresist film as the mask, and thereby, the buried semiconductor layer 31G whose conductivity type is N-type and whose depth is, for example, 1 μm is formed in the upper layer part of the semiconductor substrate 11. Then, this photo resist film is removed.

Figure 16:
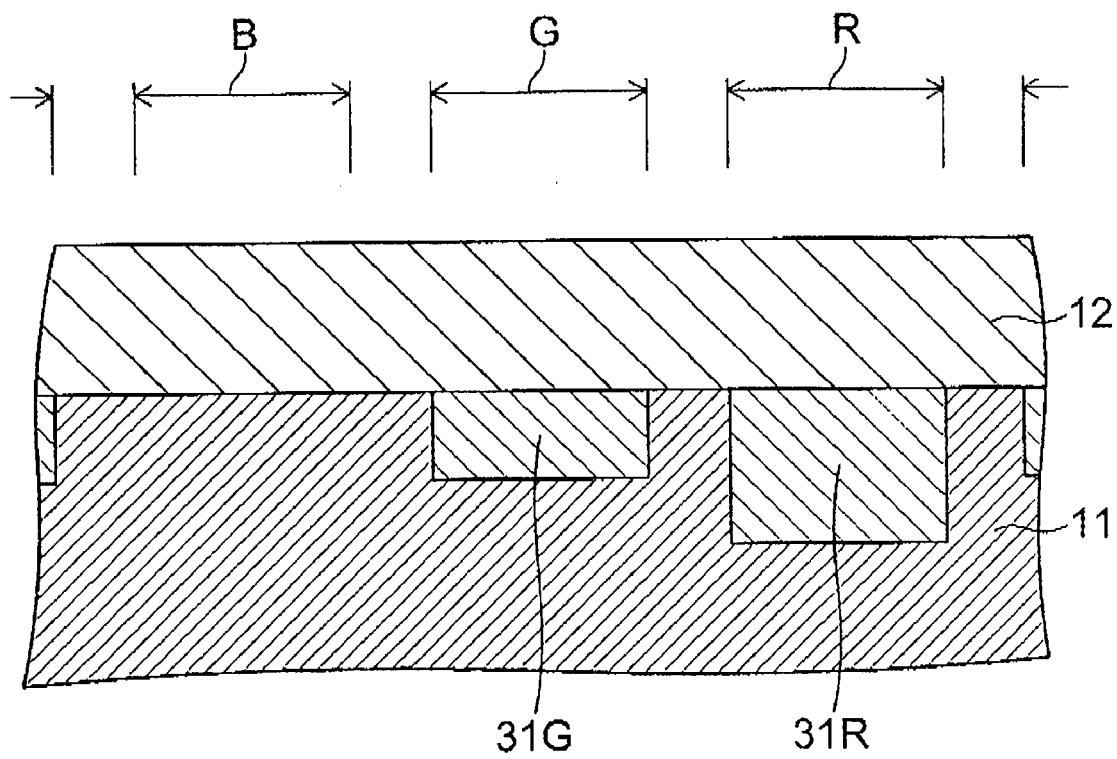
FIG. 16 is a process cross-sectional view illustrating a method for manufacturing a CMOS image sensor according to a sixth embodiment.

Next, as shown in FIG. 16, on the upper surface of the semiconductor substrate 11, for example, silicon is epitaxially grown, and thereby, the semiconductor layer 12 whose conductivity type is N-type is formed. The thickness of the semiconductor layer 12 is, for example, 3 μm. In this case, because the buried semiconductor layers 31R and 31G are exposed onto the upper surface of the semiconductor substrate 11, the semiconductor layer 12 is in contact with the buried semiconductor layers 31R and 31G.

Figure 17:
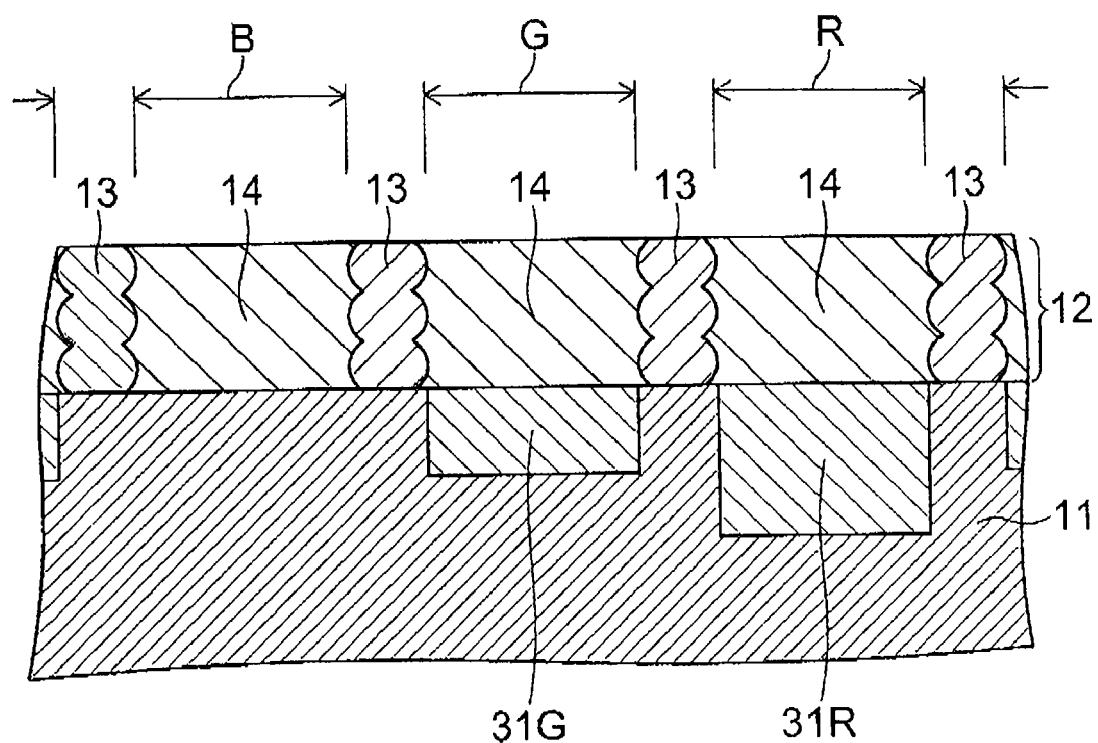
FIG. 17 is a process cross-sectional view illustrating a method for manufacturing a CMOS image sensor according to a sixth embodiment.

Next, as shown in FIG. 17, a photoresist film (not shown) is formed on the semiconductor layer 12, and the lattice-like region that is the interspace of the picture elements is opened. And, by implanting the acceptor so that the photoresist film serves as the mask, the P-type semiconductor region 13 is formed in the region that is the interspace of the picture elements. In this case, by implanting the acceptor at a plurality of times, for example, three times so that the acceleration voltages are different from one another, the acceptor is introduced over the entire region from the upper surface of the semiconductor layer 12 to the interface between the semiconductor substrate 11 and the semiconductor layer 12. Thereby, the semiconductor region 13 is formed over the entire length of the thickness direction of the semiconductor layer 12.

As a result, the semiconductor layer 12 is compartmented into a plurality of regions 14 by the semiconductor region 13. The region 14 is arranged in a matrix configuration, and the regions 14 are electrically separated from one another by the semiconductor substrate 11 and the semiconductor region 13. The semiconductor region 13 is formed so that one part of the regions 14 is located in an immediately upper region of the buried semiconductor layer 31R and so that another part of the regions 14 is located in an immediately upper region of the buried semiconductor layer 31G. In this case, for ensuring alignment between the buried semiconductor layer 31 and the semiconductor region 13, the semiconductor substrate 11 may be marked.

Figure 18:
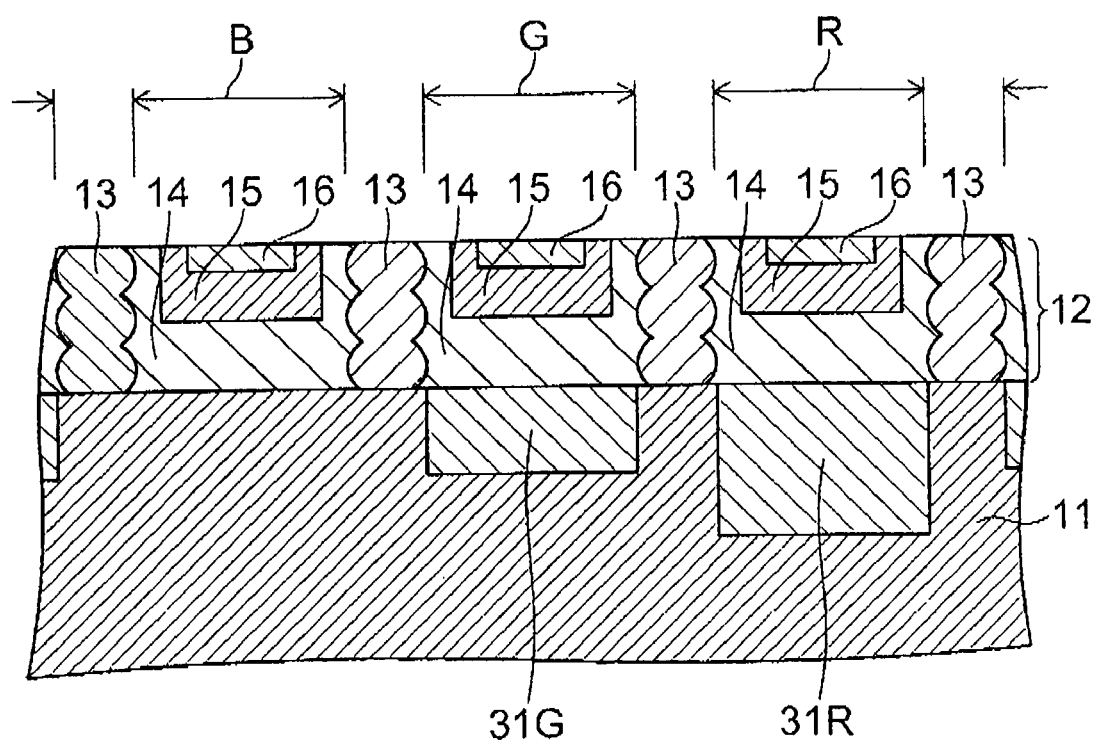
FIG. 18 is a process cross-sectional view illustrating a method for manufacturing a CMOS image sensor according to a sixth embodiment.

Next, as shown in FIG. 18, the photodiode 15 whose conductivity type is N-type is formed in the central portion of the upper layer part of each of the regions 14. In this case, the donor concentration of the photodiode 15 is set to be higher than the donor concentration of the semiconductor layer 12. Next, in the central portion of the upper layer part of the photodiode 15, the shield layer 16 whose conductivity is P-type is formed.

Next, as shown in FIG. 10, the interlayer insulating films 22 and the metal wires 23 are alternately stacked to form the multilevel wiring layer 21. Next, color filters, namely, the red filters 24R, the green filters 24G, and the blue filters 24B are formed in immediately upper regions of the respective regions 14 on the multilevel wiring layer 21. In this case, the red filters 24R are formed in the immediately upper regions of the buried semiconductor layers 31R, and the green filters 24G are formed in the immediately upper regions of the buried semiconductor layers 31G, and the blue filters 24B are formed in the other regions. Next, the planarization film 25 is formed to cover the color filters, and a plurality of microlenses 26 are formed on the planarization film 25. Each of the microlenses 26 is formed in the position corresponding to each of the color filters. Thereby, the CMOS image sensor 3 according to third embodiment described above is produced.

According to this embodiment, in the process shown in FIG. 15, the buried semiconductor layers 31R and 31G are formed in the upper layer part of the semiconductor substrate 11, and therefore, the thickness of the semiconductor layer 12 can be thinned in the process shown in FIG. 16 with ensuring the light-receiving regions having sufficient depths. Therefore, in the process shown in FIG. 17, the implantation depth of the acceptor can be shallow, and therefore, the acceleration voltage can be low, and the photoresist film serving as the mask can be thin. As a result, the CMOS image sensor can be miniaturized with ensuring the electrical separation between the regions 14.

In this case, as the depth of the buried semiconductor layer 31 is deeper, the thickness of the semiconductor layer 12 can be thinner, and therefore, the miniaturization of the semiconductor region 13 becomes easy. However, as depth of the buried semiconductor layer 31 is deeper, it becomes necessary to form the thick photoresist film used for forming the buried semiconductor layer 31, and therefore, the miniaturization of the buried semiconductor layer 31 becomes difficult. By contrast, as the depth of the buried semiconductor layer 31 is shallower, the miniaturization of the buried semiconductor layer 31 becomes easy, but the miniaturization of the semiconductor region 13 becomes difficult. Therefore, for making the difficulty of the process the lowest as a whole, it is preferable to decide the balance between the depth of the buried semiconductor layer 31 and the thickness of the semiconductor layer 12. In this embodiment, the depth of the buried semiconductor layer 31 and the thickness of the semiconductor layer 12 are set to be mutually equated.

In this embodiment, the method for manufacturing the CMOS image sensor according to the third embodiment described above has been described. The methods for manufacturing the CMOS image sensors according to the first, second, fourth, fifth embodiments described above are similar thereto.

As described above, the invention has been described with reference to the embodiments however the invention is not limited to the embodiments. For example, for each of the above-described embodiments, addition or deletion or design modification of the components, addition or omission of the processes, or condition change, which is appropriately performed by those skilled in the art, is also encompassed within the scope of the invention as long as having the spirit of the invention. Moreover, in each of the embodiments described above, the CMOS image sensor has been exemplified as the solid-state imaging device, but the invention is not limited thereto, for example, the solid-state imaging device can be a CCD (Charge-Coupled Device) image sensor.

The invention claimed is:

1. A solid-state imaging device comprising:
   a semiconductor substrate of a first conductivity type;
   a semiconductor layer of a second conductivity type formed on the semiconductor substrate;
   a semiconductor region of the first conductivity type formed over an entire length of a thickness direction of the semiconductor layer in a part of the semiconductor layer and compartmenting the semiconductor layer into a plurality of regions;
   a red filter disposed in an immediately upper region of one part of the regions; and
   a buried semiconductor layer of the second conductivity type formed in an immediately lower region of the red filter in an upper layer part of the semiconductor substrate and being in contact with the semiconductor layer.

2. The device according to claim 1, wherein as viewed from a perpendicular direction to an upper surface of the semiconductor substrate, the buried semiconductor layer is disposed inside the region.

3. The device according to claim 1, wherein as viewed from a perpendicular direction to an upper surface of the semiconductor substrate, a periphery of the buried semiconductor layer coincides with a periphery of the region.

4. The device according to claim 1, further comprising:
   a green filter disposed in an immediately upper region of another part of the regions; and
   a blue filter disposed in an immediately upper region of the other part of the regions,
   the buried semiconductor layer being not formed in an immediately lower region of the green filter and in an immediately lower region of the blue filter.

5. The device according to claim 1, further comprising:
   a green filter disposed in an immediately upper region of another part of the regions; and
   another buried semiconductor layer of the second conductivity type formed in an immediately lower region of the green filter in an upper layer part of the semiconductor substrate and being in contact with the semiconductor layer.

6. The device according to claim 5, wherein a depth of the another buried semiconductor layer is shallower than a depth of the buried semiconductor layer.

7. The device according to claim 6, further comprising:
   a blue filter disposed in an immediately upper region of the other part of the regions; and
   the buried semiconductor layer being not formed in an immediately lower region of the blue filter.

8. The device according to claim 5, further comprising:
   a blue filter disposed in an immediately upper region of the other part of the regions; and
   still another buried semiconductor layer of the second conductivity type formed in an immediately lower region of the blue filter in an upper layer part of the semiconductor substrate and being in contact with the semiconductor layer.

9. The device according to claim 8, wherein a depth of the buried semiconductor layer, a depth of the another buried semiconductor layer, and a depth of the still another buried semiconductor layer are equal to one another.

10. The device according to claim 1, wherein as viewed from a perpendicular direction to an upper surface of the semiconductor substrate, a lower part of the buried semiconductor layer extends across a periphery of the one part of the regions.

11. The device according to claim 10, wherein the lower part reaches an immediately lower region of another one of the regions that is contiguous to the one part of the regions.

12. The device according to claim 1, wherein a depth of the buried semiconductor layer is equal to a thickness of the semiconductor layer.

13. The device according to claim 1, wherein the solid-state imaging device is a CMOS image sensor.

14. A solid-state imaging device including picture elements with a plurality of colors, comprising a semiconductor part in which a conductivity type of a base part thereof is a first conductivity type and a second conductivity type region compartmented by the picture elements is formed in an upper layer part thereof, and
   a depth of the second conductivity type region corresponding to the picture element having the color with the longest wavelength out of the plurality of colors being deeper than a depth of the second conductivity type region corresponding to the picture element having another color.

15. The device according to claim 14, wherein a depth of the second conductivity type region corresponding to the picture element having the color with the second longest wavelength out of the plurality of colors is deeper than a depth of the second conductivity type region corresponding to the picture element having the color other than the color with the longest wavelength and the color with the second longest wavelength.

16. The device according to claim 14, wherein the plurality of colors are red, green, and blue.

17. A method for producing a solid-state imaging device, comprising:
   forming a buried semiconductor layer of a second conductivity type in one part of an upper layer part of a semiconductor substrate of a first conductivity type;

forming a semiconductor layer of the second conductivity type on the semiconductor substrate, the semiconductor layer being in contact with the buried semiconductor layer;

forming a semiconductor region of the first conductivity type over an entire length of a thickness direction of the semiconductor layer in one part of the semiconductor layer to compartment the semiconductor layer into a plurality of regions; and forming a red filter on the semiconductor layer, the semiconductor region being formed so that one part of the regions are located in an immediately upper region of the buried semiconductor layer, and the red filter being disposed in an immediately upper region of the buried semiconductor layer.

18. The method according to claim 17, wherein the buried semiconductor layer is formed by selectively implanting an impurity into the semiconductor substrate.

19. The method according to claim 17, wherein the semiconductor layer is formed by epitaxially growing a semiconductor material on an upper surface of the semiconductor substrate.

20. The method according to claim 17, further comprising:

forming another buried semiconductor layer of the second conductivity type in another part of the upper layer part of the semiconductor substrate; and forming a green filter on the semiconductor layer, the semiconductor region being formed so that another part of the regions are located in an immediately upper region of the another buried semiconductor layer, and the green filter being disposed in an immediately upper region of the another buried semiconductor layer.

* * * * *